US007012985B1

(12) United States Patent
Nix

(10) Patent No.: US 7,012,985 B1
(45) Date of Patent: Mar. 14, 2006

(54) FREQUENCY DIVISION OF AN OSCILLATING SIGNAL INVOLVING A DIVISOR FRACTION

(75) Inventor: Michael A. Nix, Buda, TX (US)

(73) Assignee: Xilinx, Inc., San Jose, CA (US)

( * ) Notice: Subject to any disclaimer, the term of this patent is extended or adjusted under 35 U.S.C. 154(b) by 6 days.

(21) Appl. No.: 10/909,800

(22) Filed: Jul. 30, 2004

(51) Int. Cl.
*H03K 21/00* (2006.01)

(52) U.S. Cl. .......................................... 377/48; 327/117

(58) Field of Classification Search ..................... None
See application file for complete search history.

(56) References Cited

U.S. PATENT DOCUMENTS 5,189,685 A * 2/1993 Jaffard et al. ................. 377/48
5,448,191 A * 9/1995 Meyer ........................ 327/105
5,510,742 A * 4/1996 Lemaire ..................... 327/146
6,583,674 B1 * 6/2003 Melava et al. ................ 331/16
6,760,398 B1 * 7/2004 Casagrande .................. 377/47
6,785,528 B1 * 8/2004 Carpineto ................... 455/323
6,944,257 B1 * 9/2005 Riley .......................... 377/47

* cited by examiner

*Primary Examiner*—Timothy P. Callahan
*Assistant Examiner*—Cassandra Cox
(74) *Attorney, Agent, or Firm*—LeRoy D. Maunu

(57) ABSTRACT

A frequency-divider circuit performs a division operation using a divisor that can include a fraction. In one such embodiment, a first divider module includes a divider circuit that operates to divide the frequency of an input clock signal and a phase-quadrature circuit. The first divider module generates a first-divider-output signal having periodic signals with regular phase displacement therebetween and a common period that is an integer multiple of the clock signal. Using this first-divider-output signal, a second divider module performs another divide operation and is clocked as a function of a delay effected by at least one of the periodic signals. The present invention is useful in a wide variety of applications including applications having a high frequency clock source that cannot tolerate excessive loading or jitter attributable to a divider circuit.

23 Claims, 5 Drawing Sheets

FREQUENCY DIVISION OF AN OSCILLATING SIGNAL INVOLVING A DIVISOR FRACTION

FIELD OF THE INVENTION

The present invention relates generally to data processing circuits and, more particularly, to frequency division circuits in which the divisor includes a fraction.

BACKGROUND OF THE INVENTION

Demands for high-speed data processing and communication continue to push the electronics industry to develop faster and higher functioning circuits, as has been realized in very-large-scale integration of circuits on small areas of silicon wafer. Technologies such as telecommunications and networking, for example, continue to fuel research and design efforts that facilitate serial data rate capabilities on the order of hundreds of gigabits per second and higher.

Such data-processing speeds are defined relative to a clock source that provides one or more high-frequency signals to circuits (and/or functionally-defined circuit modules) that advance through their designed (logic) states in order to perform their designed operation. In a typical application, the clock source provides a high-frequency signal that is processed through divider circuits to generate reduced-frequency clock signals used by the respective logic circuits to advance through their logic states at the appropriate rate. Thus, these data-processing speeds (or data rates) are increased mainly by the clock source, and related divider circuits.

This increase in signal frequency also increases noise, such as clock jitter, created by these circuits. Clock jitter refers to the deviation in a clock signals actual transition in time from its ideal position in time, where the signals actual transition may either lag or lead the ideal position in time. Clock jitter includes cycle-to-cycle jitter, which is the change in a signal's output transition from its corresponding position in the previous cycle, as well as period jitter, which is the maximum change in a signal's output transition from its ideal position. Since both forms of jitter are present in high-frequency clocks, the circuit designer attempting to achieve a maximum data rate would typically need to account for the short-term and long-term (accumulation of such jitter over time) effects of clock jitter.

Design specifications often define a data rate capability as well as a total jitter budget. For example, an Optical Carrier (OC)-192 compliant transceiver may have a data rate capability of 10 gigabits per second (Gbps) and may be allowed less than 1 picosecond (ps) of total jitter due to random noise. Further, only 10 ps is allowed for deterministic jitter. Because clock-signal divider circuits are often used, duplicated and distributed throughout such circuits, errors emanating from the accumulation of such jitter can significantly interfere with system performance and reliability. Therefore, predicting and reducing jitter induced by all significant sources, such as divider circuits that distribute clock signals, is important in such applications.

The potential effects of jitter in connection with such high frequency clock signals can be present in a wide variety of circuits including those implemented as functionally-defined modules, stand-alone chips or in combination with other circuit arrangements (e.g., systems or subsystems). In highly-integrated circuits, the proximity of the circuitry can increase the effects of clock jitter. Programmable devices, whether mask programmable or field programmable, are a class of highly-integrated circuits that, when configured for such high-speed data processing/transmission applications, can accentuate concerns for exceeding expected levels of normal jitter or a specification-defined jitter budget.

The field-programmable nature of FPGAs (field programmable gate array), for example, permits such a wide variance of circuit-design possibilities that the accumulated jitter in the ultimate design can be overlooked or underestimated. FPGAs may be user-programmed to perform a wide variety of functions including high-frequency clock processing (and its inherent clock distribution). Since FPGAs have become very popular for telecommunication applications, Internet applications, and switching and routing applications, all of which involve high-frequency clock processing, this concern has become increasingly important.

Certain high-frequency clock processing circuits are more likely to induce clock jitter. Clock divider circuits that include a divisor fraction, fall into this category. For instance, one type of existing circuit that performs fractional divisions uses logic circuitry that alternates between two integer divide ratios so that the average is the desired value. For example, to divide by 16 ½, the divider circuit would alternately divide using the two nearest integers as divisors (dividing by 16, by 17, by 16, and so on), so that the average divisor is 16½. The output of this divider circuit carries high levels of jitter.

Another type of divider circuit inverts the phase of the input clock for each cycle. For example, such a circuit performing a 1/division (²1½, 4½, 8½, etc.) inverts the signal to flip the phase of the input clock by 180 degrees after another decode portion of the divider indicates that the divide-by-N operation is complete. Although its output carries lower levels of measurable jitter, the circuit places a high load on the source circuit's high-speed signal being divided. This method also has timing problems in generating the phase control signal for the high-speed clock.

Accordingly, an approach that addresses the aforementioned problems, as well as other related problems, is desirable.

SUMMARY OF THE INVENTION

Various aspects of the present invention are directed to a wide variety of applications including but not necessarily limited to those applications having a high frequency clock source that normally does not tolerate excessive jitter and/or extra loading due to the presence of the divider circuit. Implementations of the present invention are intended to serve such applications in a manner that addresses and overcomes the above-mentioned issues as well as others.

According to a first example embodiment, a frequency-divider circuit performs a division operation using a divisor that includes a fraction. A first divider module includes a divider circuit that operates to divide the frequency of an input clock signal and a phase-quadrature circuit. The first divider module generates a first-divider-output signal having periodic signals with regular phase displacement therebetween and a common period that is an integer multiple of the clock signal. Using this first-divider-output signal, a second divider module performs another divide operation and is clocked as a function of a delay effected by at least one of the periodic signals.

According to a more specific embodiment, the above-described embodiment has a first stage that includes the first divider module, and a second stage that includes the second divider module as well as a timing control circuit. The timing control circuit uses the phase-displaced outputs of the first divider module to clock the second divider module and provide a delay that corresponds to (e.g., a period of) the input clock signal.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 3A illustrates a first stage of the example specific clock-divider circuit, FIG. 3B illustrates its second stage, and FIG. 3C illustrates a timing circuit of the second stage.

Figure 1:
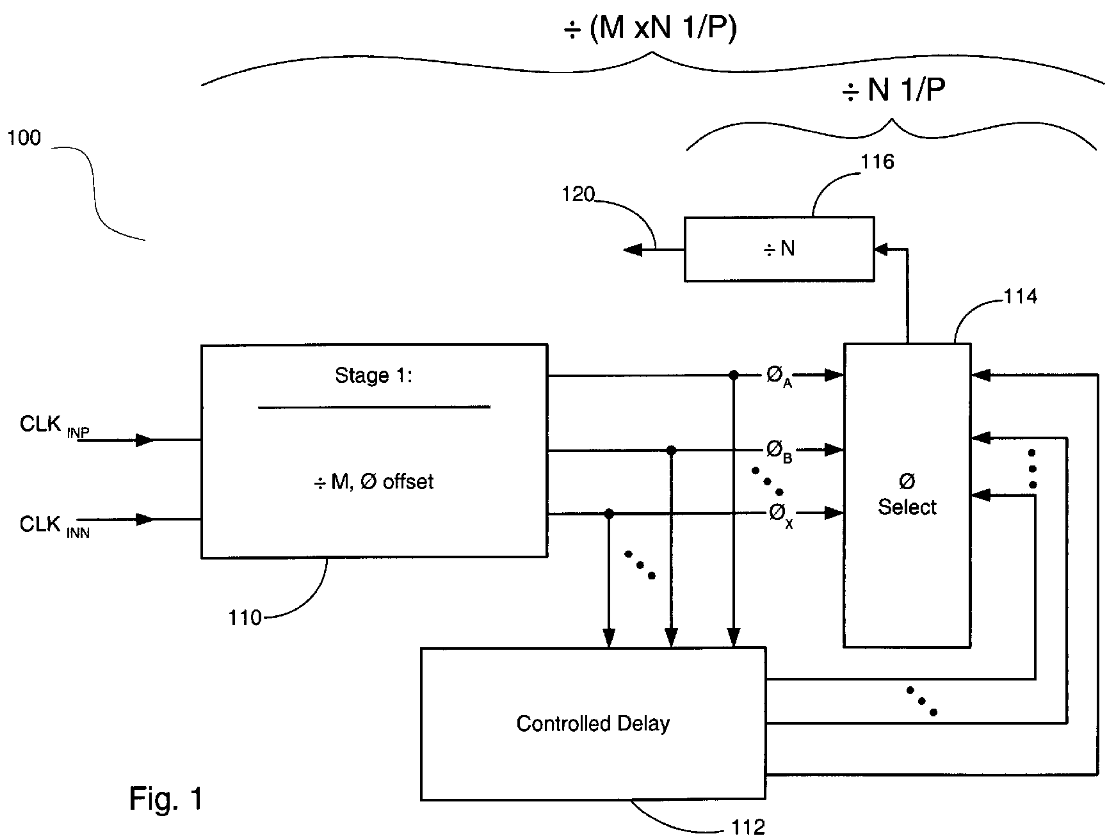
FIG. 1 is a schematic block diagram of a clock-divider circuit in accordance with one aspect of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be generally applicable to high-speed clock division involving divisors that include a fraction. The invention has been found to be particularly advantageous for high-speed clock division applications that may be susceptible to jitter and/or may need to be implemented with providing an excessive load to the input clock source. Examples of applications that might be sensitive to such issues include those implemented using general-purpose integrated circuits and programmable logic devices. While the present invention is not necessarily limited to such applications, an appreciation of various aspects of the invention is best gained through a discussion of examples in such an environment.

According to a first example, the present invention is embodied in the form of a frequency divider circuit that performs a division operation using a divisor that includes a fraction, for example, 5½, 8¾ or 16¼. While not required, the skilled artisan would recognize that such division is implemented with binary logic when the number's whole integers and the denominator of the fraction circuit are a multiple of two. In this example, the frequency divider circuit includes a first divider module and a quotient output stage including a second divider module. The first divider module is designed to perform a first divide operation on a clock signal and, using the result of this first divide operation, to generate a certain type of first-divider-output signal. This first-divider-output signal has substantially identical periodic signals with regular phase displacement therebetween and a common period that is an integer multiple of the input clock signal.

In a specific example application, the first-divider-output signal is a signal having three phase-offset components: phase-A component, phase-B component and phase-C component, each being offset from each other by sixty degrees. The second divider module, which is part of the quotient output stage in this example, performs a second divide operation that is selectively clocked (to effect logic-state advancements) using the phases of first-divider-output signal with these first-divider-output phases being used to adjust the divisor defining the second division operation. According to this embodiment, the first divide function is typically defined by a whole number, and the second divide function is typically defined as a multiple of one of the phase components; as a more specific example, with the first divider function using 4 as a divisor and the second divide using 5⅔ as a divisor, the overall division would produce an output frequency that corresponds to the input frequency divided by the product of these two numbers; that is, the output frequency would be equal to input frequency divided by 22⅔.

To appreciate how such first-divider-output phases are used to adjust the divisor defining the second division operation, consider an example situation in which the output of a conventional divide-by-four module is used to clock a subsequent (cascaded) divide-by-six module. The divide-by-six module would produce an output that multiplies these two divisors (i.e., four times six) to produce an output signal having a frequency that corresponds to the original input signal frequency divided by 24. According embodiments of to the present invention, rather than using the conventional non-phase-shifted first-divider output, its so-called phases are used to define equal time segments of the first-divider output's period. One or more of these phases are then used to delay the times at which the second divider module is clocked. By modifying the preceding example to an example in which the overall division is 25 (rather than 24), quadrature phases of the first-divider output are used to shift the clocking to the second "divide-by-six" module by ¼ of the period of the first-divider output. Thus, with the quadrature phases of the first-divider output representing a divide-by-four operation, the quarter-phase timing to drive the clock of the second divider module is used to effect a cascaded divide by 6¼ operation, with the end result being the product of 4 times 6¼, or a divide-by-25 operation.

Figure 2:
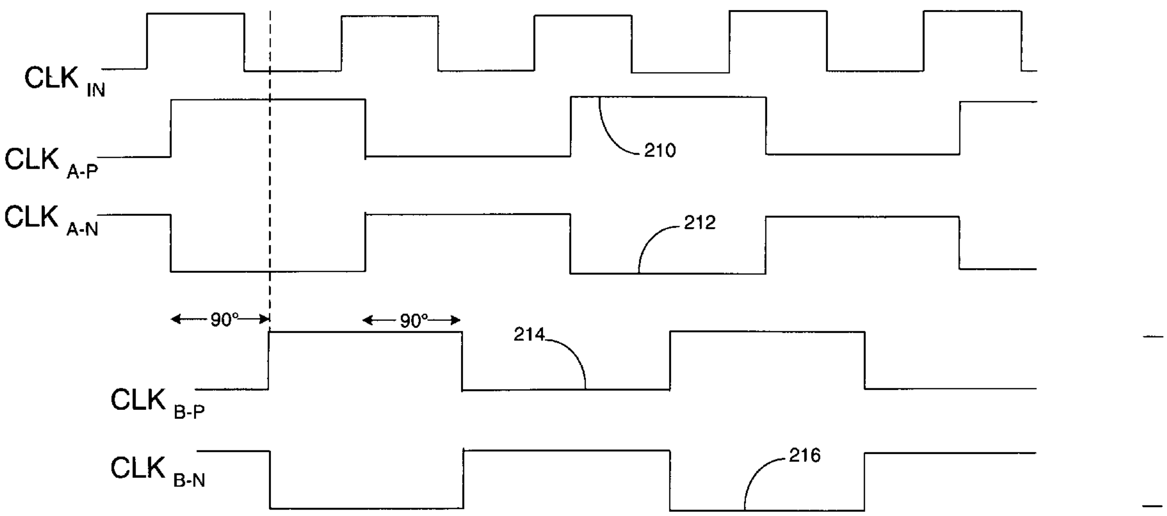
FIG. 2 is a timing diagram illustrating an output having identical periodic signals with regular phase displacement, in accordance with another aspect of the present invention.

As yet another embodiment of the present invention, FIG. 1 is a schematic block diagram of a clock-divider circuit in which a first divider module performs a divide-by-M operation and a second divider module performs a divide-by N 1/p operation to yield an overall divide-by "M×N 1/p" operation. For purposes of facilitating discussion of FIG. 1, a particular example embodiment and application assumes that M equals 2, N equals 8, and p (the denominator) equals 4, to yield an overall divide-by 16½ operation. Again using this embodiment and application, FIG. 2 is a timing diagram illustrating a quadrature output having positive/negative pairs of substantially identical periodic signals ($CLK_{A-P}$/$CLK_{A-N}$ and $CLK_{B-P}$/$CLK_{B-N}$) 210, 212, 214 and 216 with a 90 degree phase displacement.

In FIG. 1, the overall divide-by "M×N 1/p" operation is provided by clock-divider circuit 100 having a first stage 110 and a second stage including a controlled delay circuit 112, a phase (ϕ) selector 114 and a divide-by-N circuit 116 (or divide-by-8 circuit in this example). The first stage 110 includes circuitry for producing the positive and negative components ($CLK_{-P}$ and $CLK_{-N}$) of the quadrature output signals $CLK_A$ and $CLK_B$.

In the second stage, the controlled delay circuit 112 and the phase selector 114 cooperatively interact to selectively clock the divide-by-8 circuit 116. The divide-by-8 circuit 116 is clocked by tracking the phases and polarity of the quadrature signals produced via the first stage 110. More specifically, each of these four signals is used in succession to clock the divide-by-8 circuit 116 and to effect a divide by 8¼ of the quadrative clock ($CLK_A$ or $CLK_B$). The divide-by-8 circuit 116 is clocked by one of the four phases of the quadrative clock, with the particular phase for clocking being selected for use at a particular time which is determined by the delay circuit 112 tracking each time a time segment transpires; particularly, at the same polarity edge (rising or negative) of one of the four signals output by the first stage 110. Since the quadrative clock performs a divide-by-2 operation on the high-speed input clock ($CLK_{IN}$), as discussed above, the output port 120 of the divide-by-8 circuit 116 effects a divide by 16½ of $CLK_{IN}$.

Figure 3A:
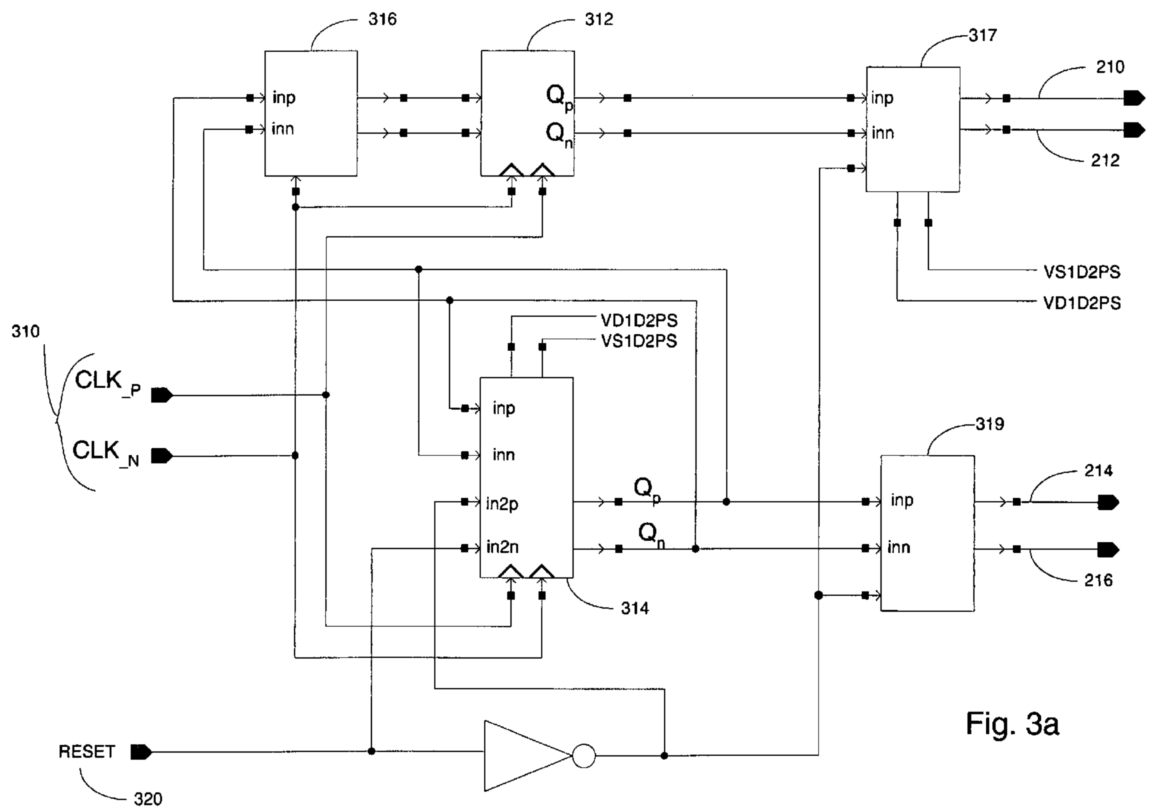
FIGS. 3A, 3B and 3C schematically illustrate an example specific clock-divider circuit that exemplifies one manner for implementing an embodiment of the present invention, where
Figure 3B:
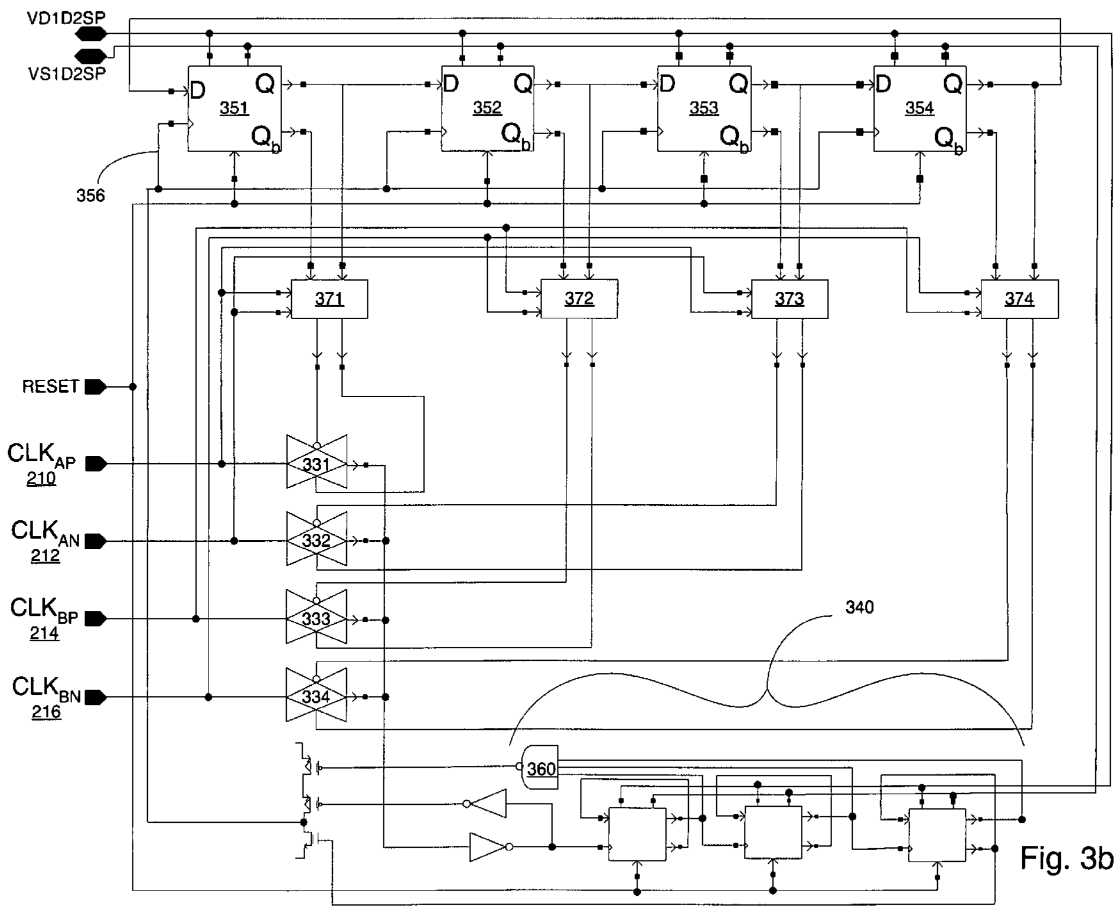
Figure 3C:
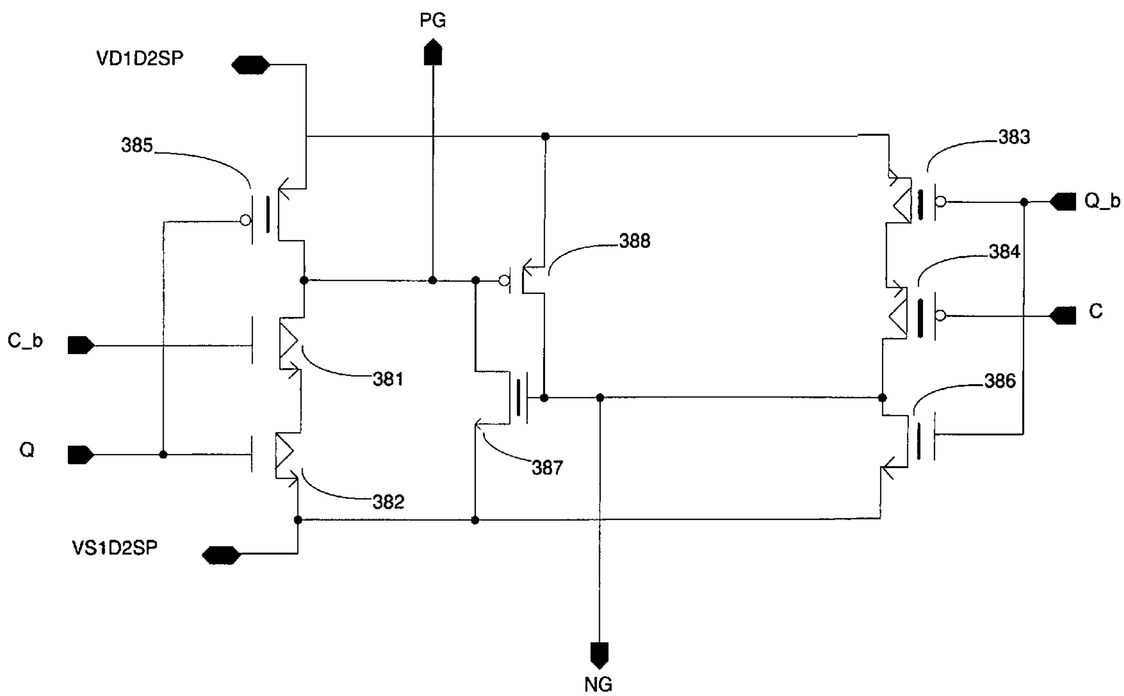

Also in accordance with embodiments of the present invention, FIGS. 3A, 3B and 3C represent a specific example clock-divider circuit corresponding to the modules and circuits depicted in FIG. 1. FIG. 3A illustrates one way to implement the first stage 110 of FIG. 1, and FIG. 3B illustrates one way to implement the remaining portion of FIG. 1.

Referring now to FIG. 3A (an example of Stage 110 in FIG. 1), the high-speed input clock ($CLK_{IN}$) 310 is shown as having positive and negative polarity for driving similarly-constructed master/slave D-type flip flops 312 and 314, and with the negative polarity used to enable a latch 316. The inputs to the latch 316, as well as the inputs of the D-type flip flop 314, are generated by the data outputs of the D-type flip flop 314. The inputs to the D-type flip flop 312 are generated by the data outputs of the latch 316. The construction of the D-type flip flops 312 and 314 differ only in that the D-type flip flop 314 has power-down/reset control provided by reset signal depicted at line 320.

The first divide-by operation as well as the signals shown in FIG. 2 are recognizable in FIG. 3A from a functional perspective. The D-type flip flop 314 performs the above-discussed divide-by-2 operation. The latch 316 and the D-type flip flop 312 provide a ½-cycle delay (relative to the period of the input clock 310 at its falling edge) that is used by master/slave D-type flip flops 312 and 314 (of the same type) to generate the quadrature signals 210, 212, 214 and 216 shown in FIG. 2 via buffers 317 and 319. The signals 210, 212, 214 and 216 are shown in FIG. 1 as $\phi A\ \phi_B$, $\phi_C$, . . . $\phi_X$, respectively, where X=D in this embodiment.

In FIG. 3B, these quadrature signals 210, 212, 214 and 216 are shown as inputs to a set of four digital transmission gates 331–334 that can be viewed as an implementation of the phase selector 114 of FIG. 1. One of the gates 331–334 is enabled at a time for clocking a divide-by-8 circuit 340; this circuit 340 can be viewed as an implementation of the divide-by-N circuit 116 of FIG. 1.

The particular gate that is selected for clocking the divide-by-8 circuit 340 is chosen by the eight blocks of circuitry shown along the top of FIG. 3B. Along the very top of FIG. 3B, four D-type flip-flop circuits 351–354 represent a four-bit shift register having their data inputs and outputs serially cascaded with the output of the flip-flop circuit 354 driving the data input of flip-flop circuit 351. The respective clocks of these flip-flop circuits 351–354 are tied to a common signal (at line 356)

A decode circuit (NAND gate) 360 triggers this clock to the flip-flop circuits 351–354 when the inputs to the NAND gate 360 indicate that each of the outputs of the divide-by-8 circuit 340 is at a logical one state. As mentioned above, the divide-by-8 circuit 340 is clocked by one of the four phases of the quadrature clock. Which phase of the four is being used at a particular time is determined by a four-bit shift register (circuits 351–354) that are configured to contain three logical zeros and a logical one. The logical one in the shift register selects the phase that clocks by the divide-by-8 circuit 340 via the common output of gates 331–334.

When the NAND-gate 360 decodes this output of the divide-by-8 circuit 340, a clock is sent to the four-bit shift register (circuits 351–354) to rotate its contents by one place. This rotation causes the next phase of the quadrative clock to be used by the divide-by-8 circuit 340. The timing during phase changes that results in the delayed clocking of the divide-by-8 circuit 340 is 2½ cycles of the high-speed clock instead of two of its cycles.

Timing cells 371–374 of FIG. 3B are used to facilitate activation of the gates 331–334 for an input clock ($CLK_{IN}$) that is oscillating at a frequency that is relatively high (e.g., about 1 GHz or more) in view of circuit propagation times. FIG. 3C illustrates an expanded view of one of these similarly-constructed cells, each having MOS-type transmission gates 381–388. These transmission gates 381–388 are controlled so that only one of the four transmission gates 331–338 is on at any given time.

Another design consideration for such a high-speed implementation involves impedance loading of the input clock source. Such a high-speed implementation would typically include an input clock source (not shown in the Figures) providing the input signal (e.g., to the first divider module 110 of FIG. 1) with an oscillation frequency in the 0.5 to 10 GHz range (or even higher). By using one of the above-described embodiments, load provided at the input port of the first divider module is typically a high-impedance port, which places a minimal impedance load on such a load-sensitive clock source.

Other embodiments of the present invention include the first divider function implemented as a number including a fraction. As one such embodiment, the first module is implemented with one of the previously-described first and second divider modules discussed herein as other embodiments of the present invention. In this context, the first divider function includes two such divider circuits, and a second output stage includes another divider stage that is implemented in a manner similar to the second divider circuit of the front-end stage.

As one of ordinary skill in the art would appreciate, other embodiments may be derived from the teaching of the present invention without deviating from the scope of the claims.

What is claimed is:

1. A frequency divider circuit for performing a division operation using a divisor that includes a fraction, the circuit comprising:

- a first divider module adapted to perform a first divide operation on a clock signal and generate a first-divider-output signal having periodic signals with regular phase displacement therebetween and a common period that is an integer multiple of the clock signal; and
- a quotient output stage including a second divider module adapted to perform a second divide operation that is clocked as a function of a delay effected by at least one of the periodic signals and of an overall quotient.

2. The circuit of claim 1, wherein the first divide operation performed by the first divider module includes a whole number divisor.

3. The circuit of claim 1, wherein the quotient output stage includes a timing control circuit adapted to generate another clock signal that is used to clock the second divider module, and further includes a circuit adapted to define the second divide operation such that the divisor includes a whole integer plus a fraction that is one of ¼ and ¾.

4. The circuit of claim 3, wherein the other clock signal is produced as a function of the periodic signals of the first-divider-output signal.

5. The circuit of claim 4, wherein the other clock signal is also produced as a function of the overall quotient.

6. The circuit of claim 1, wherein the first and second divide operations are defined, respectively, by first and second sub-divisors, at least one of which includes a fraction.

7. The circuit of claim 6, wherein the overall quotient is a product of the first sub-divisor and the second sub-divisor.

8. The circuit of claim 1, wherein the periodic signals are quadrature-phase output signals, and wherein the quotient output stage is adapted to generate another clock signal that is used to clock the second divider module.

9. A frequency divider circuit for performing a division operation using a divisor that includes a fraction, the circuit comprising:

first means for performing a first divide operation on a clock signal and generating a first-divider-output signal having periodic signals with regular phase displacement therebetween and a common period that is an integer multiple of the clock signal; and second means for performing a second divide operation that is clocked as a function of a delay effected by at least one of the periodic signals and of an overall quotient.

10. A frequency divider circuit for performing a division operation using a divisor that includes a fraction, the circuit comprising:

a first quadrature-divider module adapted to perform a first divide operation on a first clock signal and generate a first-divider-output signal having quadrature output signals and common period that is an integer multiple of the first clock signal;

a second divider module adapted to perform a second divide operation that is clocked by a clock input signal; and a control circuit adapted to provide the clock input signal as a function of a delay effected by an overall quotient for the division operation and a time segment referenced by the quadrature output signals.

11. The circuit of claim 10, wherein the first-divider-output signal includes output signals that are polarity complements of the respective quadrature output signals.

12. The circuit of claim 10, wherein the control circuit includes a decode circuit responsive to the second divide operation.

13. The circuit of claim 12, wherein the control circuit is further adapted to use the decode circuit to track phases of the quadrature output signals.

14. The circuit of claim 13, wherein the control circuit is further adapted to track the phases of the quadrature output signals in order to provide the clock input signal at instances that define the second divide operation such that the divisor includes a whole integer plus a fraction that is one of ¼ and ¾.

15. The circuit of claim 10, wherein the control circuit is further adapted to track phases of the quadrature output signals in order to provide the clock input signal to define the second divide operation by the divisor that includes the divisor fraction.

16. The circuit of claim 10, wherein at least one of the first and second divide operations is defined by a divisor that includes a whole number.

17. The circuit of claim 10, wherein the first divide operation is defined by a whole number divisor.

18. The circuit of claim 17, wherein the second divide operation is defined by a number that includes a fraction having a denominator that is greater than two.

19. The circuit of claim 10, wherein the first divide operation is defined by a whole number divisor, and the second divide operation is defined by a number that includes a fraction having a denominator that is equal to four.

20. The circuit of claim 10, wherein the first divide operation is a divide by 2 operation and the second divide operation is a divide by 8¼ operation.

21. A frequency divider circuit for performing a division operation using a divisor that includes a fraction, the circuit comprising:

first means for performing a first divide operation on a first clock signal and generating a first-divider-output signal having quadrature output signals and a period that is an integer multiple of the first clock signal;

second means for performing a second divide operation that is clocked by a clock input signal; and third means for providing the clock input signal as a function of a delay effected by at least one of the periodic signals and of an overall quotient.

22. A frequency divider circuit for performing a division operation using a divisor that includes a fraction, the circuit comprising:

a first quadrature-divider module adapted to perform a first divide operation on a first clock signal and generate a first-divider-output signal having quadrature output signals whose period is an integer multiple of the first clock signal;

a quotient output stage including a second divider module adapted to perform a second divide operation that is clocked by a clock input signal, the divisor being a product of at least the first and second divide operations; and a control circuit adapted to provide the clock input signal as a function of a delay effected by at least one of the periodic signals and of an overall quotient.

23. The circuit of claim 22, wherein the first divide operation is a divide by 2 operation and the second divide operation is a divide by 8¼ operation.

* * * * *